United States Patent
Appelt et al.

(10) Patent No.: US 7,344,915 B2
(45) Date of Patent: Mar. 18, 2008

(54) METHOD FOR MANUFACTURING A SEMICONDUCTOR PACKAGE WITH A LAMINATED CHIP CAVITY

(75) Inventors: Bernd Karl Appelt, Hanroth (DE); Ching-Hua Tsao, Yunghe (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 411 days.

(21) Appl. No.: 11/078,384

(22) Filed: Mar. 14, 2005

(65) Prior Publication Data

US 2006/0205119 A1    Sep. 14, 2006

(51) Int. Cl.
*H01L 21/00* (2006.01)

(52) U.S. Cl. ............... 438/106; 438/118; 257/684; 257/E21.5

(58) Field of Classification Search ........... 438/106, 438/118; 257/684, E21.5
See application file for complete search history.

(56) References Cited

U.S. PATENT DOCUMENTS

| | | | | |
|---|---|---|---|---|
| 5,037,779 A | * | 8/1991 | Whalley et al. | 257/687 |
| 5,689,091 A | * | 11/1997 | Hamzehdoost et al. | 174/255 |
| 5,926,696 A | * | 7/1999 | Baxter et al. | 438/118 |
| 6,195,264 B1 | | 2/2001 | Lauffer et al. | 361/762 |
| 6,501,168 B1 | | 12/2002 | Castro et al. | 257/700 |
| 6,506,626 B1 | | 1/2003 | Chiu | 438/108 |
| 6,515,356 B1 | * | 2/2003 | Shin et al. | 257/678 |
| 6,620,650 B2 | * | 9/2003 | Nakata et al. | 438/107 |
| 6,639,304 B1 | | 10/2003 | Oggioni et al. | 257/660 |
| 6,861,737 B1 | * | 3/2005 | Jeong et al. | 257/680 |
| 6,931,723 B1 | * | 8/2005 | Powell | 29/852 |
| 7,151,228 B2 | * | 12/2006 | Takase et al. | 174/255 |
| 7,274,095 B2 | * | 9/2007 | Fee et al. | 257/680 |
| 2001/0046725 A1 | | 11/2001 | Ho | 438/121 |
| 2002/0100967 A1 | * | 8/2002 | Gaku et al. | 257/707 |
| 2003/0015348 A1 | * | 1/2003 | Lee et al. | 174/260 |
| 2003/0036229 A1 | * | 2/2003 | Nakata et al. | 438/200 |
| 2004/0040856 A1 | * | 3/2004 | Hamano | 205/123 |
| 2006/0115670 A1 | * | 6/2006 | Tanaka et al. | 428/615 |

* cited by examiner

*Primary Examiner*—Matthew Smith
*Assistant Examiner*—Ankush K Singal
(74) *Attorney, Agent, or Firm*—Troxell Law Office, PLLC

(57) ABSTRACT

A method for manufacturing a semiconductor package with a laminated chip cavity is disclosed. A board and a metal foil having a layer of adhesive resin are provided. The metal foil is laminated with the board to make the adhesive resin be attached to the board. Next, a through opening is formed to pass through the board, the adhesive resin and the metal foil. Next, the metal foil is removed to expose an adhesive surface of the adhesive resin on the board so as to attach a carrier plate, thereby forming a chip cavity.

22 Claims, 8 Drawing Sheets

METHOD FOR MANUFACTURING A SEMICONDUCTOR PACKAGE WITH A LAMINATED CHIP CAVITY

FIELD OF THE INVENTION

The present invention relates to manufacture of semiconductor packages, more particularly, to a method for manufacturing a semiconductor package with a laminated chip cavity.

BACKGROUND OF THE INVENTION

Conventionally in the field of semiconductor packages and modules, a substrate with a chip cavity utilized for accommodating a semiconductor chip is rather common. The chip cavity consists of a chip cavity inwall and a chip-attached plane. In order to control the height of the chip cavity inwall and the flatness of the chip-attached plane, initially the chip cavity inwall and the chip-attached plane are separately manufactured from different substrates, then the substrate with a chip cavity inwall and the substrate with a chip-attached plane are laminated utilizing an adhesive layer to form a laminated substrate assembly with a chip cavity. As disclosed in U.S. Pat. No. 6,506,626 and U.S. Pat. Application Publication No. 2001/0046725, the substrate with a chip-attached plane is a ball grid array circuit board and the substrate with a chip cavity inwall is a metal stiffener or a spacer circuit board, both substrates are assembled together to be a substrate assembly with a chip cavity for manufacturing a semiconductor package or module with a laminated face-up chip cavity. Also as disclosed in U.S. Pat. No. 6,639,304 and U.S. Pat. No. 6,501,168, the substrate with a chip-attached plane is a metal plate or metal core. Besides, the substrate with a chip cavity inwall is a circuit board with a through opening or a window. Both substrates are assembled together to manufacture semiconductor package or module with face-down chip cavity.

Normally, the adhesive layer applied for laminating the two above-mentioned substrates is acrylate film, liquid adhesive or prepreg. When the adhesive layer is a tape of solid type or gummy type such as acrylate film or prepreg, it is necessary to punch or route an opening in the tape, then the tape is sandwiched between the two substrates to laminate together under the opening of the tape being aligned to the chip-attached plane of the substrate. However, because of the nature of the adhesive tape, the adhesive tape will stick the tools or particles during process, which caused extra problem for cleaning tools and degradation of adhesion. Moreover, the arcylate film is very sensitive to moisture and only can reach JEDEC level four. Furthermore, prepreg may be easily damaged and form in lots of resin flakes or particles during routing or punching process.

When liquid adhesive serves as an adhesive layer to bond the above-mentioned two substrates, it is known that the liquid adhesive needs to apply to the substrate with a chip cavity inwall or to the substrate with a chip-attached plane by means of printing. In order to prevent the adhesive from contaminating the chip cavity inwall during laminating the two substrates, the liquid adhesive must have powerful adhesion with proper surface tension and viscosity. The liquid adhesive will be needed to pass through a pre-bake or drying process after screen printing and then the above-mentioned two substrates are laminated and cured under higher temperatures. However, the curing condition needs to be extremely controlled during curing process, otherwise any mistake may force the liquid adhesive layer to flow to the chip cavity inwall or chip-attached plane and cause the poor flatness for chip attachment.

A method for manufacturing chip cavity on a substrate is disclosed in U.S. Pat. No. 6,195,264. An adhesive layer between the substrate is made of photoimageable material can be interposed between a metal stiffener and a printed circuit board to form a substrate assembly with a chip cavity after lamination, and there is no residual of the adhesive layer in the chip cavity after exposing and developing the photoimageable adhesive layer. However, the requirements for the adhesive layer with photosensitive material should have an excellent photosensitivity and easy photo processing characteristics, moreover, good thermal-setting properties, adhesion, and heat conductivity. However, such kind of adhesive layer with photosensitive material is not easy to get which is in higher cost.

SUMMARY OF THE INVENTION

It is a primary purpose of the present invention to provide a method for manufacturing a semiconductor package with a chip cavity. Initially, a board and a metal foil with a layer of adhesive resin are provided and then laminated together. It is noted that the adhesive resin is attached to the board. Thereafter, a through opening is formed to pass through the board, the adhesive resin and the metal foil to make the board have a chip cavity in the through opening. Next, the metal foil is removed to expose an adhesive surface of the adhesive resin on the board and then can be attached to a carrier plate to form a chip cavity. The adhesive resin will not overflow into the chip cavity and there is no flaking occurred, which reduces contamination against the chip cavity and has a benefit of attaching the carrier plate to the board under a lower temperature.

It is a secondary purpose of the present invention to provide a method for manufacturing a semiconductor package with a chip cavity. A metal foil, which serves as a carrier for a layer of adhesive resin for lamination, it may decrease contamination against tool and be transferred to a board using a laminating step, an opening-forming step and a removal step of metal foil. Further, the board with the adhesion resin is attached to a carrier plate so as to obtain a chip cavity that there is a precise depth of chip cavity and no adhesive remained therein, thereby obtaining a semiconductor package at good quality.

According to the method for manufacturing a semiconductor package with laminated chip cavity, a board is provided and a metal foil with a layer of adhesive resin is provided. The board has at least a region for forming chip cavity inwall which is defined. The adhesive resin has a first adhesive surface attached to the metal foil and a second adhesive surface exposed. Thereafter, the board and the metal foil are laminated that allows the second adhesive surface of the adhesive resin to be attached to the board. Next, a through opening is formed corresponding to the region by applying routing or punching method. The through opening passes through the board, the adhesive resin and the metal foil to make the board has a chip cavity inwall in the through opening. Next, the metal foil is removed to expose the first adhesive surface of the adhesive resin. Next, the first adhesive surface of the adhesive resin is attached to a carrier plate to connect with the board. Next, a chip is disposed on the carrier plate within the chip cavity inwall of the board. Accordingly, either face-up or face-down semiconductor package can be manufactured with a lower cost.

DETAILED DESCRIPTION OF THE INVENTION

Figure 1A:
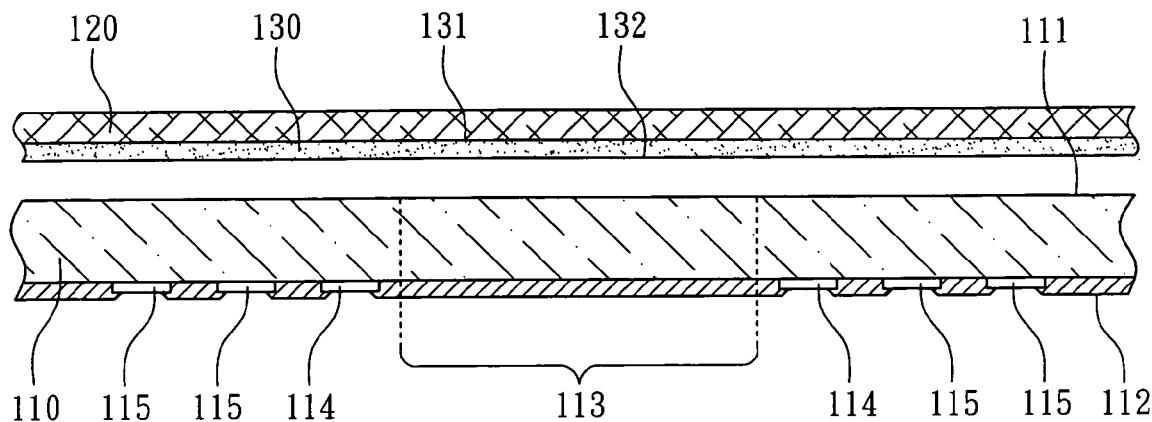
FIG. 1A to FIG. 1J are cross-sectional views of a board during a semiconductor package manufacturing process in accordance with the first embodiment of the present invention.

Referring to the drawings attached, the present invention will be described by means of embodiments below.

According to the present invention, a method for manufacturing a semiconductor package is illustrated in the first embodiment. As shown in FIG. 1A, initially a board 110 is provided, and a metal foil 120 with a layer of adhesive resin 130 is provided. The board 110 has a first surface 111 and a second surface 112 opposing to the first surface 111, and defines at least a region 113 for forming chip cavity inwall. In this embodiment, the board 110 is a substrate having circuit patterns and is suitable for forming a face-down chip cavity, such as a printed circuit board containing BT resin. The first surface 111 is utilized for attaching a carrier plate 150 (as shown in FIG. 1). A plurality of conductive fingers 114 for connecting with bonding wires and a plurality of ball pads 115 for connecting with solder balls are formed on the second surface 112. Generally, there is no need to coat any adhesive material on the first surface 111 of the board 110.

The metal foil 120 is preferably made of a metal material easy to be etched such as copper foil. By means of printing or sputtering method, a layer of the adhesive resin 130 is formed on a surface of the metal foil 120 and then partially cured. The adhesive resin 130 has a first adhesive surface 131 attached to the metal foil 120 and a second adhesive surface 132 exposed. The adhesive resin 130 should have multi-stage curing characteristics and the material thereof can be selected from one of the group consisting of epoxy resin, BT resin, PI resin, or prepreg containing glass fiber. It is desired that the adhesive resin 130 contains metal particles such as Ag particles to improve heat conductivity thereof. In this embodiment, the metal foil 120 accompanied with the adhesive resin 130 is a Resin Coated Cooper foil (RCC), which can be mass-produced with a lower cost.

Figure 1B:
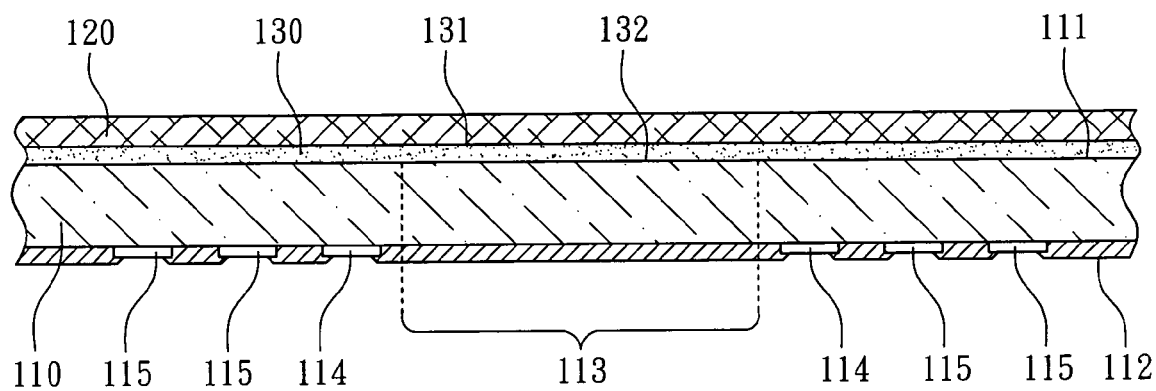

Next, as shown in FIG. 1B, the board 110 and the metal foil 120 are laminated together, it is noted that the second adhesive surface 132 of the adhesive resin 130 is attached to the first surface 111 of the board 110 under a lower temperature to assemble a lamination without fully cured. It is better that the adhesive resin 130 is cured between about 5-50%, furthermore 5-15% is the best, and which is partially cured during the laminating step. The adhesive resin 130 is compressed by the metal foil 120 and has a uniform thickness after above-mentioned laminating step, so that the generated particles and contamination due to overflow can be reduced to facilitate process without contaminating tool.

Figure 1C:
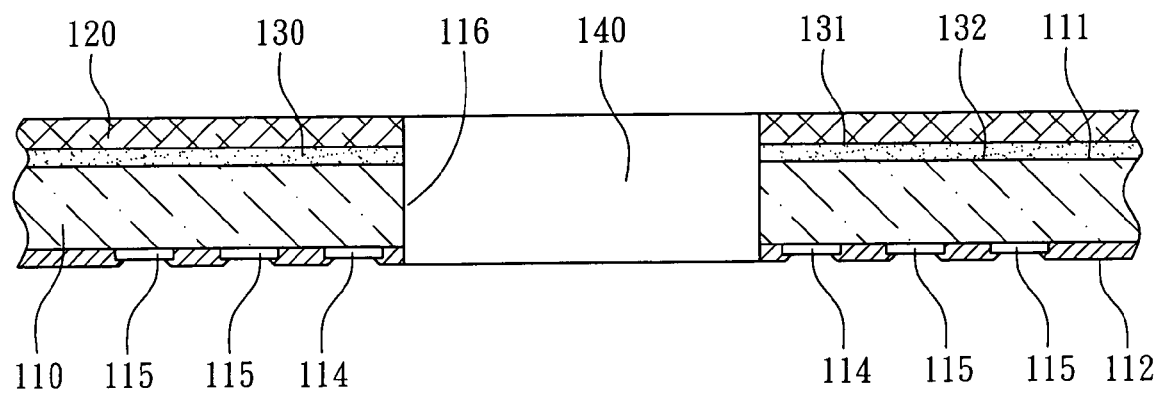
Figure 2:
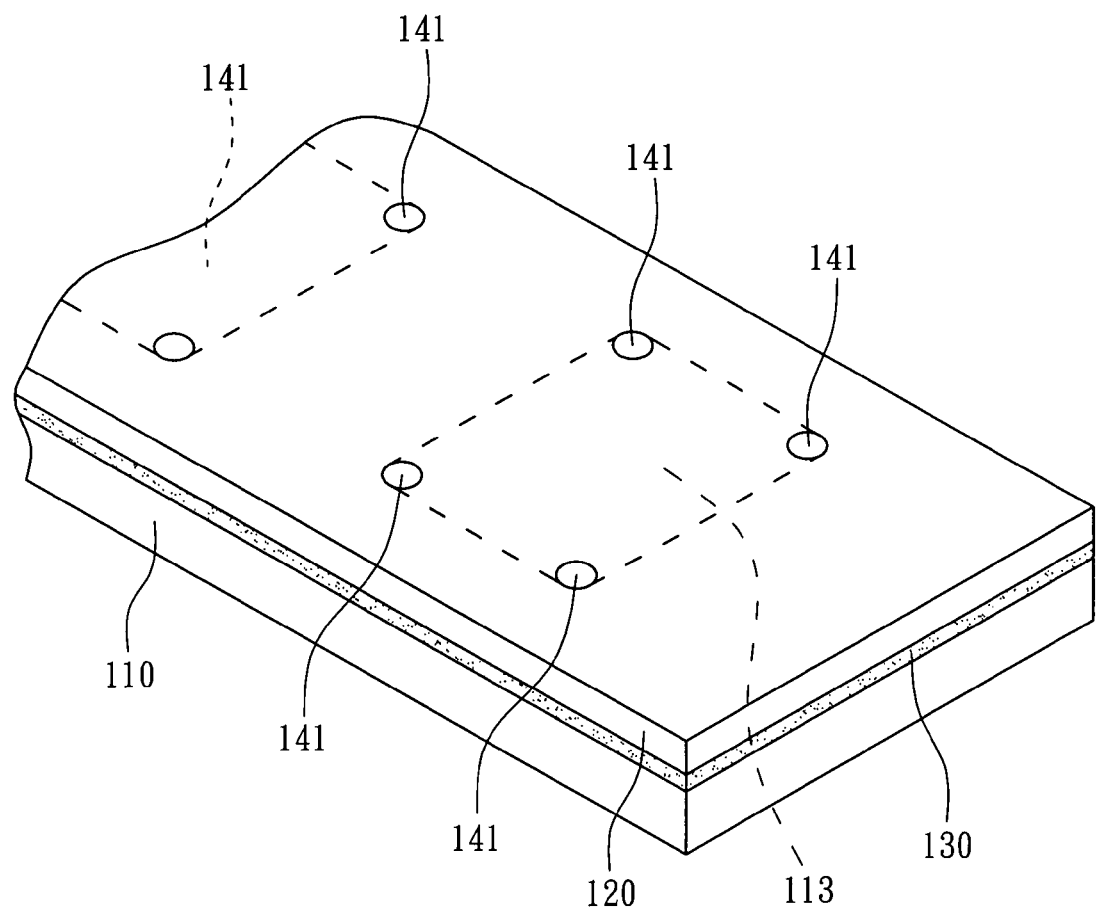
FIG. 2 is a three-dimensional view of the laminated assembly of the board with a metal foil having pre-cutting holes in accordance with the first embodiment of the present invention.
Figure 3:
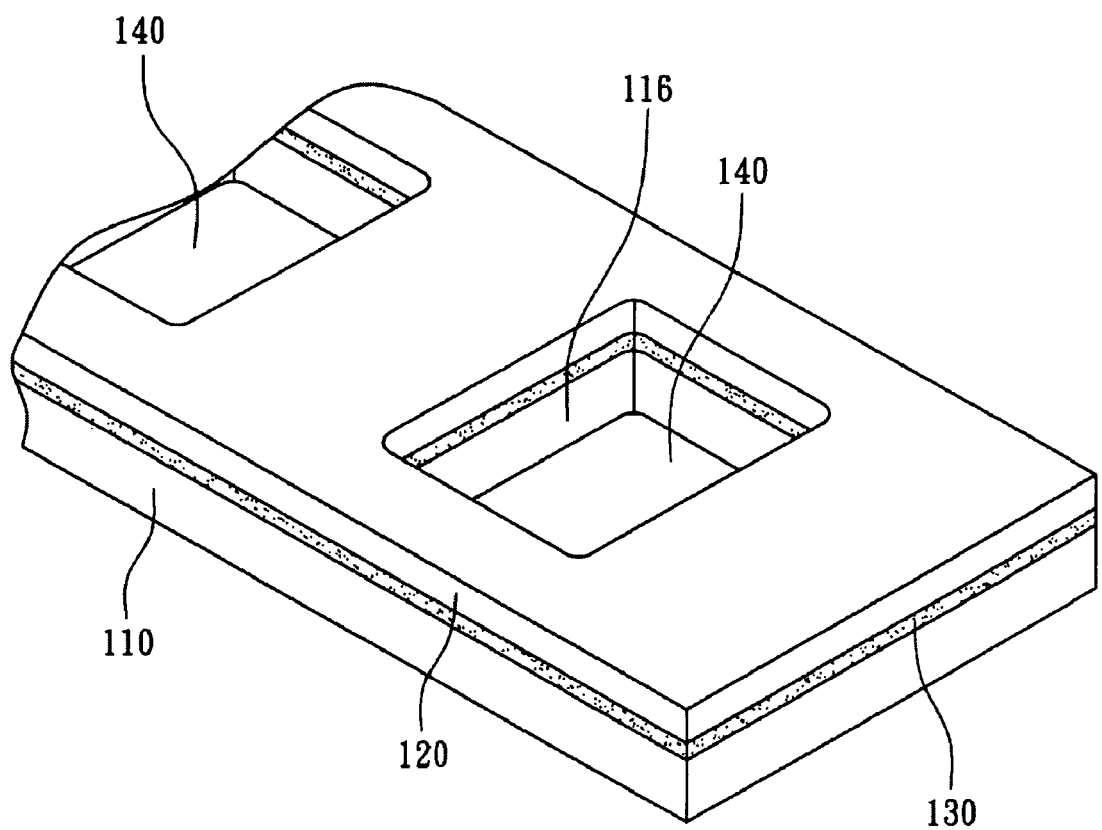
FIG. 3 is a three-dimensional view of the laminated assembly of the board with the metal foil having through holes in accordance with the first embodiment of the present invention.

Next, as shown in FIGS. 1C and 3, a through opening 140 is formed on the laminated assembly to pass through the metal foil 120, the adhesive resin 130 and the board 111 using routing, punching or other technique. Referring to FIG. 2, at least a pre-cutting hole 141 may be pre-formed prior to forming the through opening 140. The pre-cutting holes 141 pass through the board 110, the adhesive resin 130 and the metal foil 120, and are preferably located at the corners of the region 113 for a routing operation. The through opening 140 corresponds to the region 113 so that the board 110 has a chip cavity inwall 116 in the through opening 140.

Figure 1D:
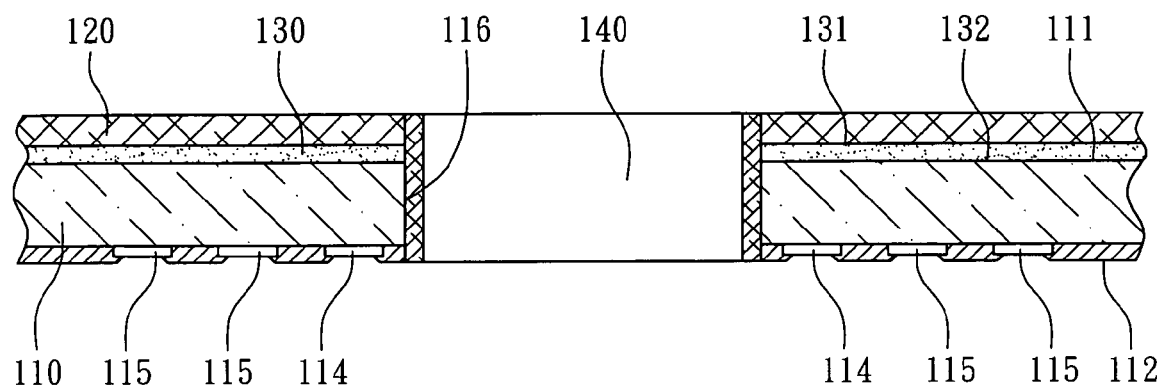

As shown in FIG. 1D, a shielding step can be performed optionally after forming the through opening 140. When it is necessary, a metal layer 142, such as Ni/Au layer, is formed on the chip cavity inwall 116 by utilizing plating or sputtering technique to electrically shield a chip 160 and internal circuit pattern of the board 110(as shown in FIG. 1J). The metal foil 120 may provide a plating conductive path while the metal layer 142 is formed.

Figure 1E:
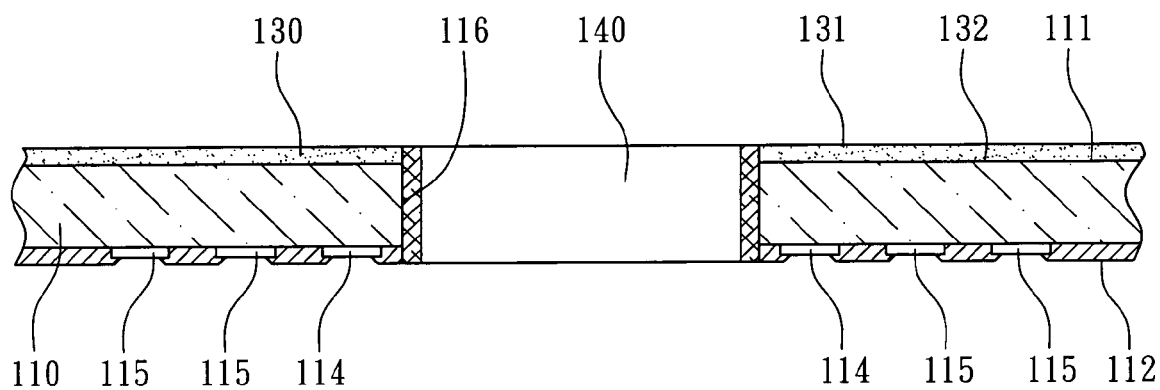

Next, as shown in FIG. 1E, the metal foil 120 is removed by etching or peeling method to expose the first adhesive surface 131 of the adhesive resin 130. Therefore, the adhesive resin 130 can be transferred to the first surface 111 of the board 110 without contamination of the chip cavity inwall 116 of the board 110 by the above-mentioned laminating step, the above-mentioned forming step of through opening and the above-mentioned removal step of the metal foil. The adhesive resin 130 is not fully cured so that the first adhesive surface 131 of the adhesive resin 130 still owns enough adhesion characteristics. Moreover, when the metal foil 120 is removed by etching, the metal layer 142 can further protect the internal circuit pattern of the board 110 from being etched.

Figure 1F:
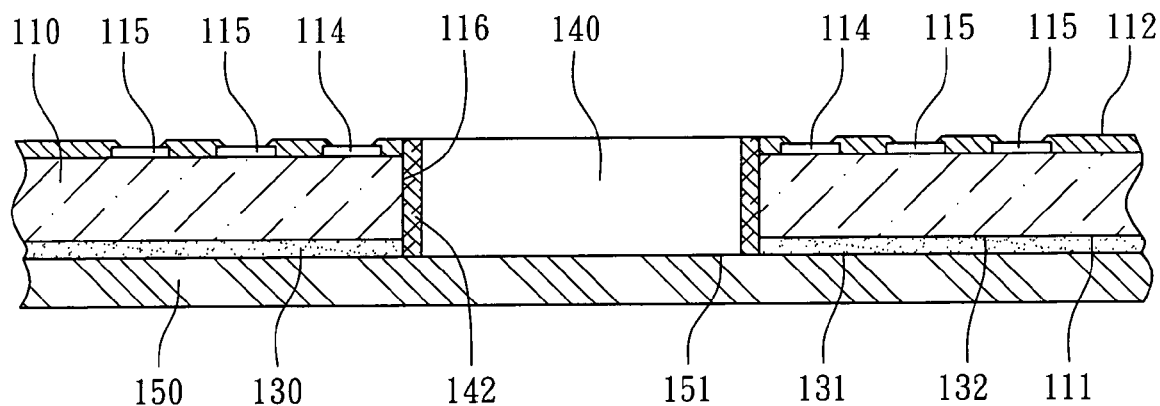

Next, as shown in FIG. 1F, the first adhesive surface 131 of the adhesive resin 130 is attached to a carrier plate 150 to connect with the board 110. It is noted that the carrier plate 150 has a chip-attached plane 151 of chip cavity exposed to the through opening 140 and assembled with the chip cavity inwall 116 of the board 110 to form a chip cavity. Referring to FIG. 1F, the depth and shape of the foregoing chip cavity can precisely be defined; moreover, the chip-attached plane 151 is extremely flat for manufacturing a semiconductor package. Furthermore, the adhesive resin 130 does not overflow to contaminate the chip cavity inwall 116 and the chip-attached plane 151 without alignment problem that is necessary for the traditional adhesive tape. In this embodiment, the carrier plate 150 having chip-attached plane 151 is a heat spreader.

Figure 1G:
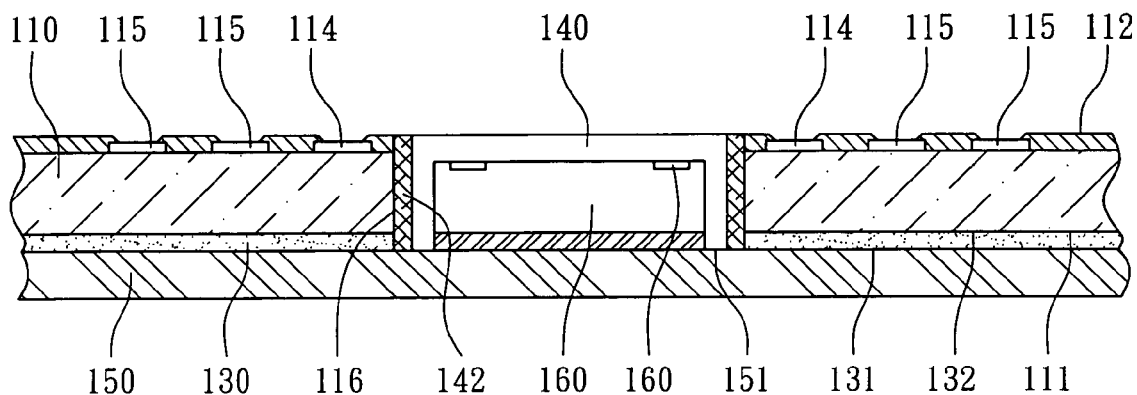
Figure 1H:
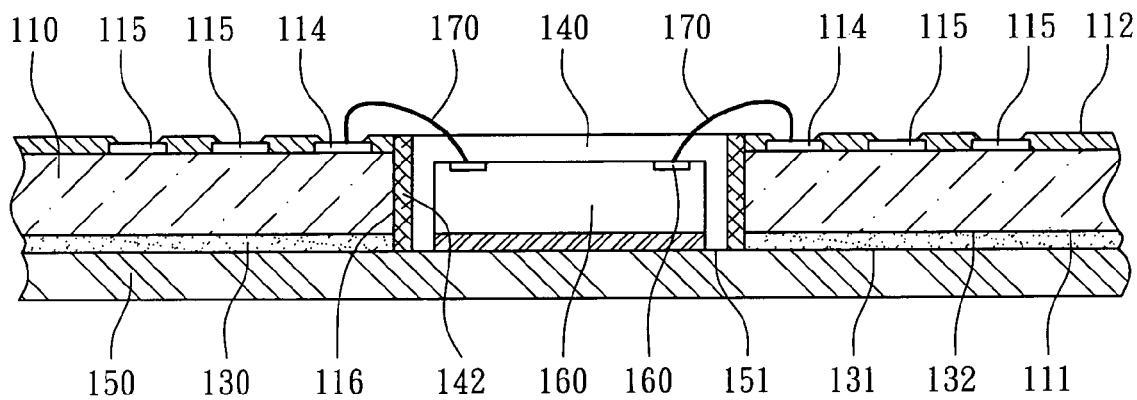
Figure 1I:
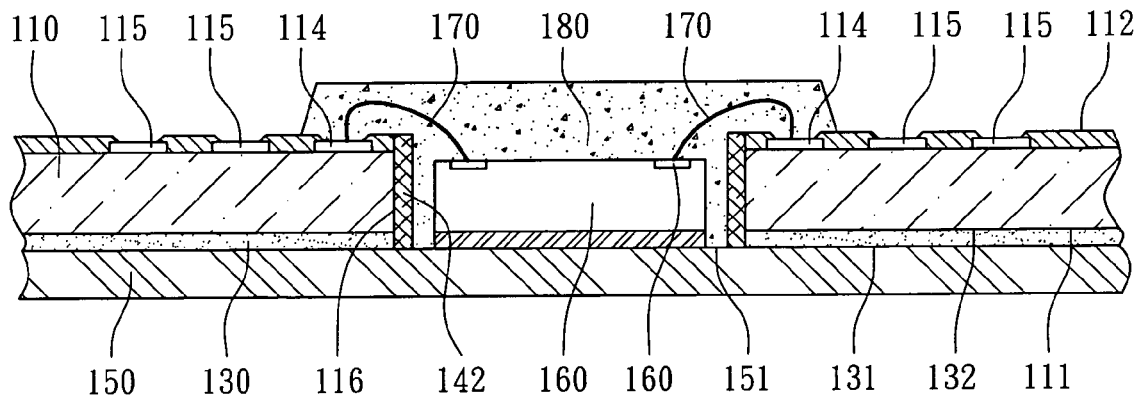
Figure 1J:
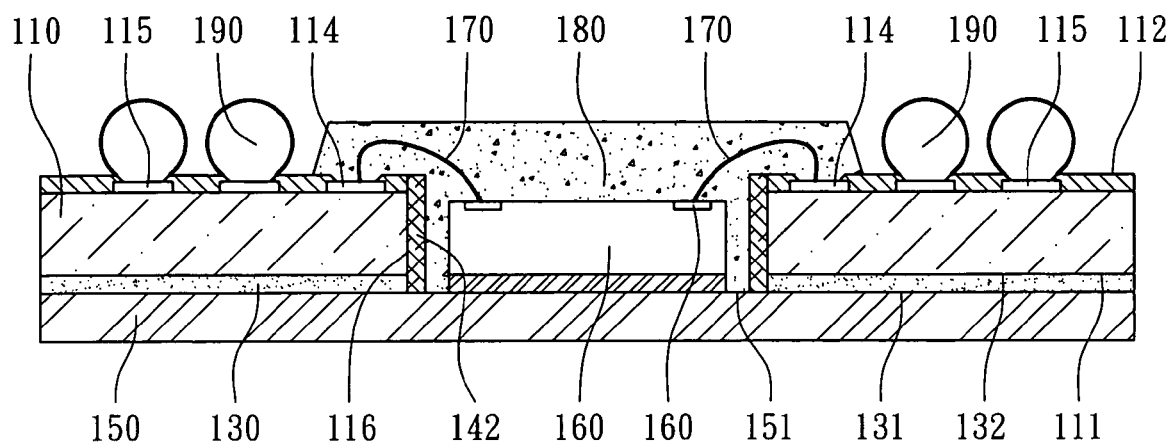

Next, as shown in FIG. 1G, a semiconductor chip 160 is attached to the chip-attached plane 151 of the carrier plate 150 and is located within the chip cavity inwall 116 of the board 110 (i.e. the through opening 140). In this embodiment, a wire bonding step is further included. As shown in FIG. 1H, a plurality of bonding wires 170 are utilized to connect a plurality of bonding pads 161 of the semiconductor chip 160 with the conductive fingers 114 of the board 110. Next, in this embodiment a packaging step is further included. As shown in FIG. 1I, an encapsulant 180 is formed in the chip cavity consisting of the chip cavity inwall 116 and the chip-attached plane 151 by applying molding or dispensing method to seal the chip 160 and the bonding wires 170. Next, in this embodiment, a forming step of external terminals is further included. As shown in FIG. 1J, a plurality of solder balls 190 are disposed on the ball pads 115 of the second surface 112 of the board 110 to form a semiconductor package with face-down chip cavity. The adhesive resin 130 can be fully cured after the formation of chip cavity or after formation of the encapsulant 180.

Accordingly, in the above-mentioned method for manufacturing a semiconductor package, the adhesive resin 130 does not overflow to the chip cavity inwall 116 of the chip cavity and the chip-attached plane 151 without flaking. In addition, although the first surface 111 of the board 110 is slightly uneven, it can be adjusted by means of the adhesive resin 130 during the step of laminating the board 110 with the metal foil 120.

Figure 4A:
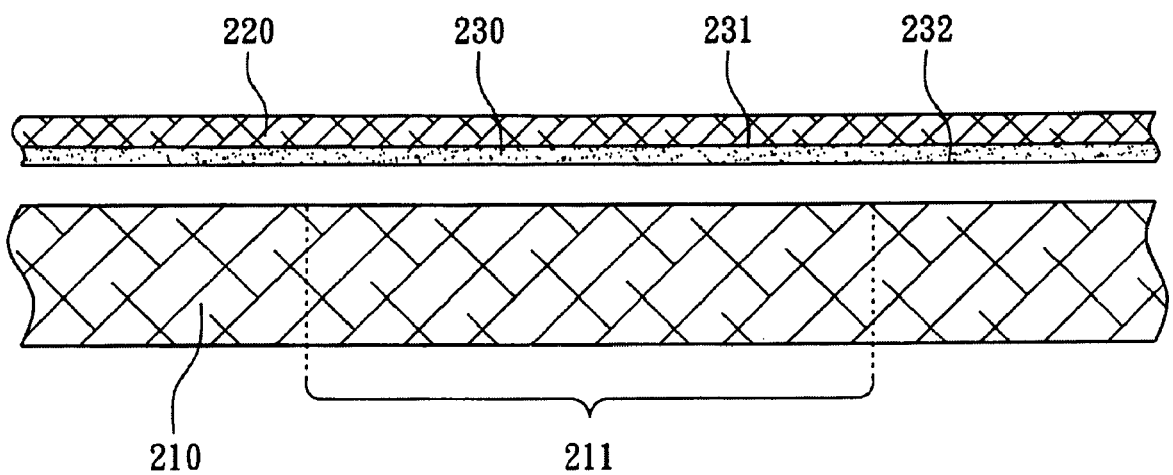
FIG. 4A to FIG. 4I are cross-sectional views of a board during another semiconductor package manufacturing process in accordance with the second embodiment of the present invention.

Moreover, the method for manufacturing a semiconductor package in accordance with the present invention can be applied for manufacturing semiconductor package of different packaging type, such as image sensor chip package with face-up chip cavity. The second embodiment of the present invention is illustrated below. Referring to FIG. 4A, initially a board 210 is provided, which has a first surface 211 and a second surface 212 opposing to the first surface 211. In addition, a metal foil 220 with a layer of adhesive resin 230 is provided. In this embodiment, the board 210 is a substrate core made of prepreg including glass fiber. At least a region 213 for forming chip cavity inwall is defined in the board 210. The adhesive resin 230 is formed on one surface of the metal foil 220. The adhesive resin 230 has a first adhesive surface 231 attached to the metal foil 220 with a second adhesive surface 232 exposed.

Figure 4B:
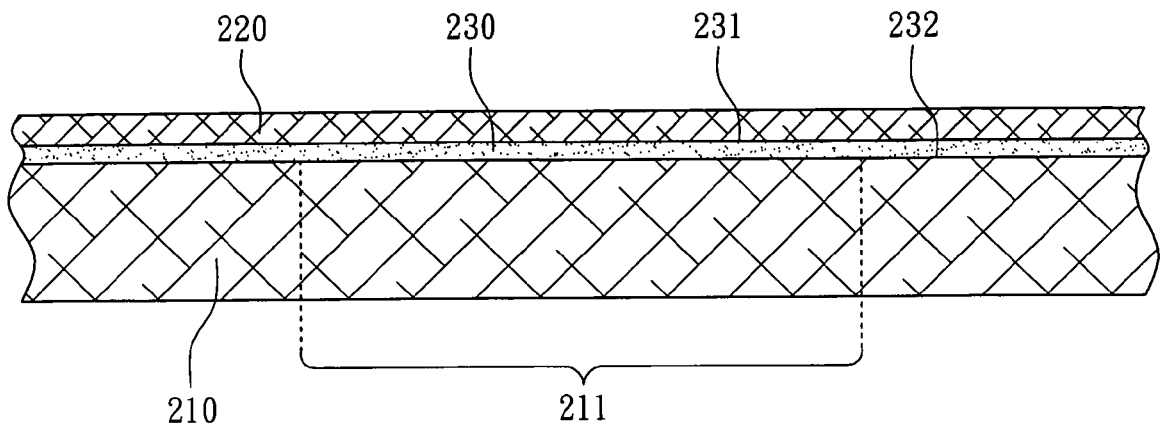

Next, as shown in FIG. 4B, the metal foil 220 and the board 210 are laminated together, so that the second adhesive surface 232 of the adhesive resin 230 is attached to the first surface 211 of the board 210 to assemble a lamination. It is desired that the surface of the metal foil 220 used for forming the adhesive resin 230 should be flat.

Figure 4C:
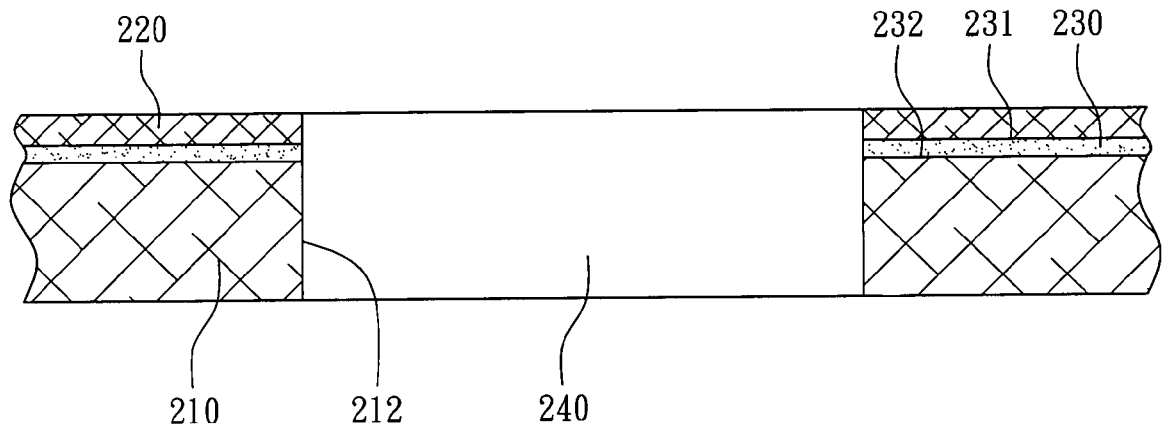

Next, as shown in FIG. 4C, a through opening 240 is formed by punching method through the foregoing lamination including the board 210, the metal foil 220 and the adhesive resin 230. The through opening 240 corresponds to the region 213 and passes through the board 210, the adhesive resin 230 and the metal foil 220 to make the board 210 have a chip cavity inwall 212 in the through opening 240.

Figure 4D:
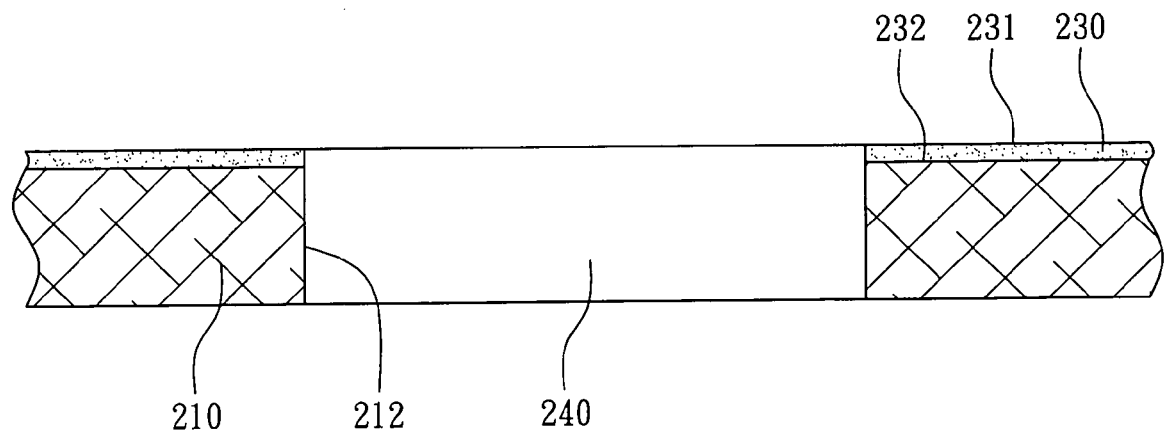
Figure 4E:
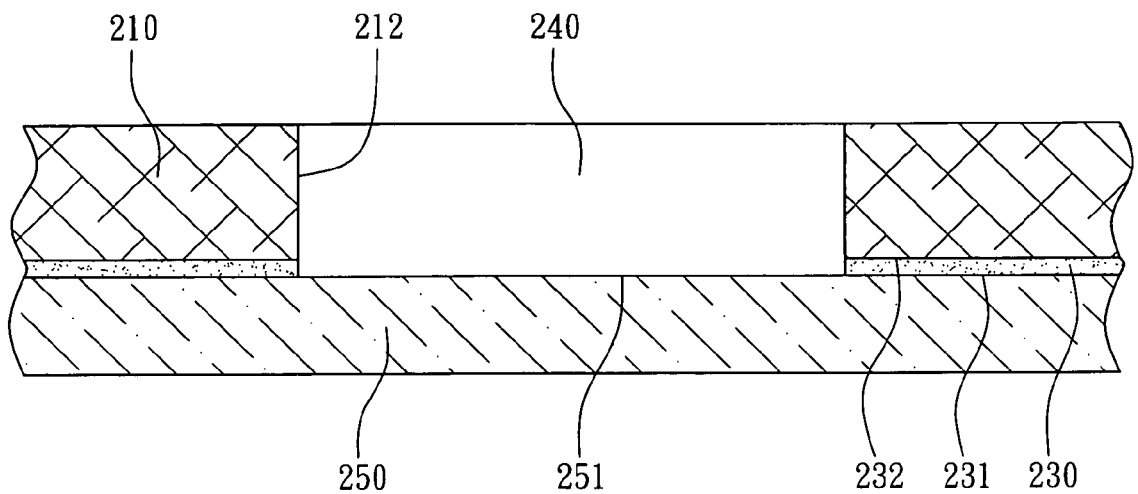

Next, as shown in FIG. 4D, the metal foil 220 is removed by peeling or etching method. Next, as shown in FIG. 4E, the first adhesive surface 231 of the adhesive resin 230 is attached to a carrier plate 250 to connect the board 210 with the carrier plate 250. The carrier plate 250 has a chip-attached plane 251 of chip cavity to be assembled with the chip cavity inwall 212 of the board 210 to form a chip cavity. In this embodiment, the carrier plate 250 is a substrate with circuit patterns.

Figure 4F:
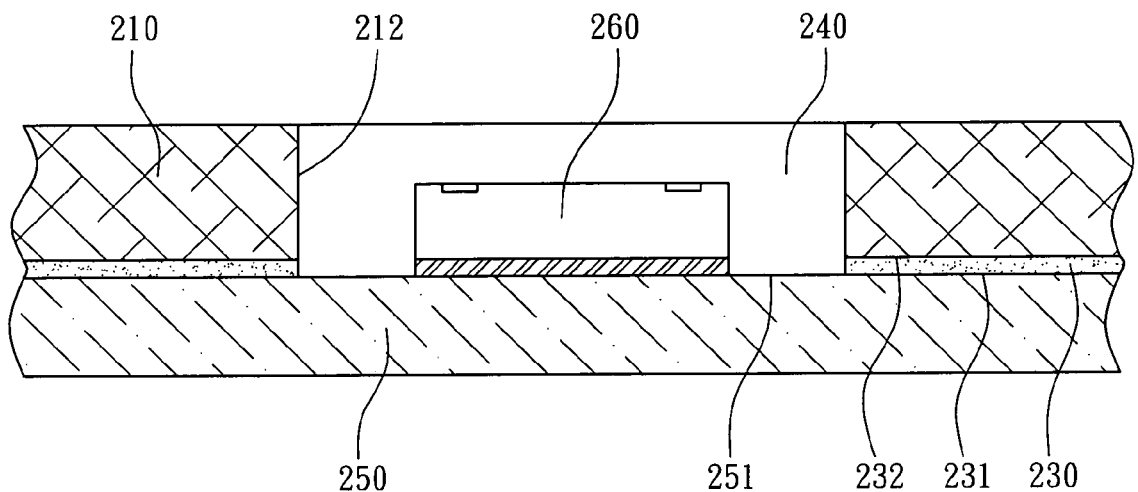
Figure 4G:
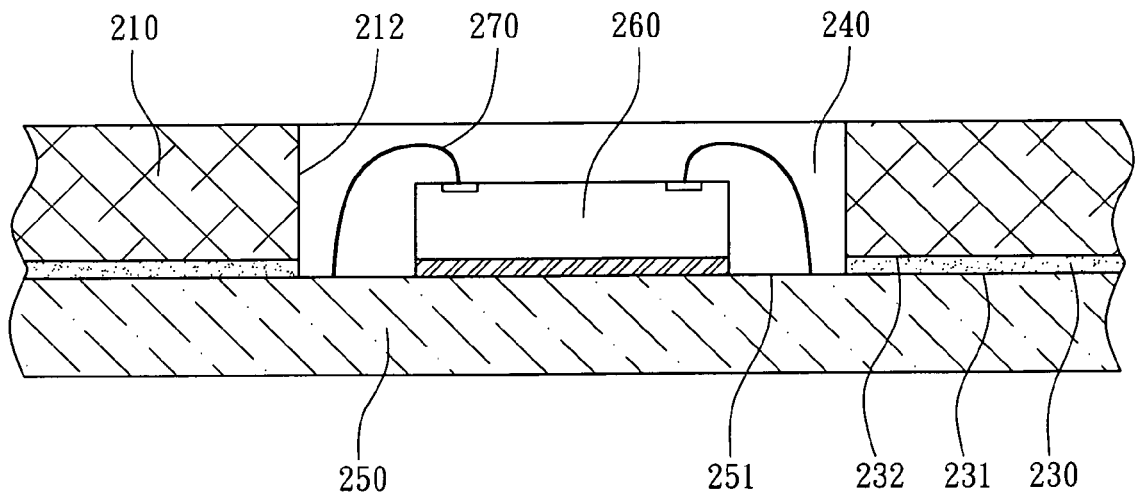
Figure 4H:
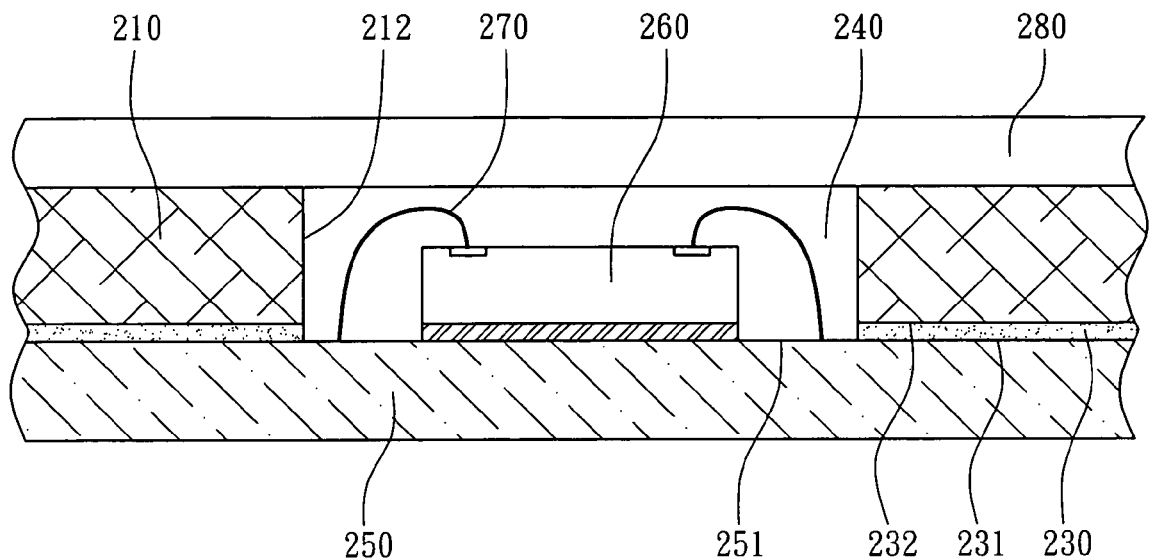
Figure 4I:
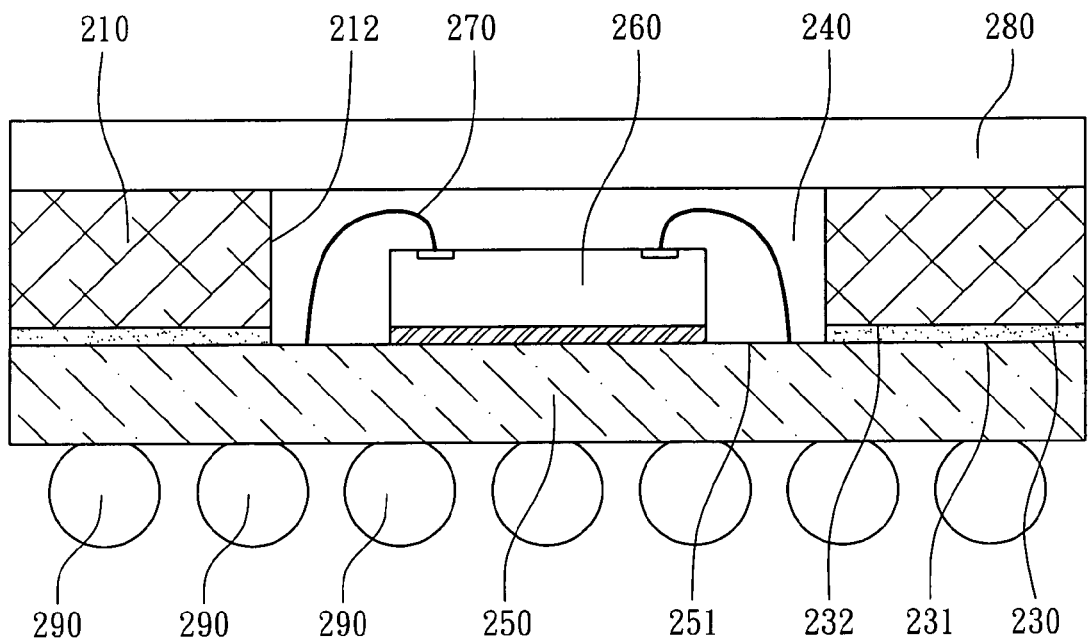

Next, as shown in FIG. 4F, a semiconductor chip, such as image sensor chip, is attached to the chip-attached plane 251 of the carrier plate 250 within the chip cavity inwall 212 of the board 210, i.e. the through opening 240. Next, in this embodiment as shown in FIG. 4G, a plurality of bonding wires 270 formed by wire bonding method are utilized to electrically connect the semiconductor chip 260 with the carrier plate 250. Next, a sealing step is further performed in this embodiment. As shown in FIG. 4H, a transparent glass cover 280 is disposed on the board 210 to hermetically seal the chip 260, otherwise a transparent encapsulant (not shown in the drawing) is formed in the chip cavity composed of the chip cavity inwall 212 and the chip-attached plane 251. Next, a forming step of external terminals is further performed in this embodiment. As shown in FIG. 4I, a plurality of solder balls 290 are placed on a lower surface of the carrier plate 250 to form a semiconductor package with a face-up chip cavity.

Accordingly, in accordance with the above-mentioned embodiment, the chip cavity, which is composed of the chip cavity inwall 212 of the board 210 and the chip-attached plane 251 of the carrier plate 250, has an excellent flatness so that the active surface of the semiconductor chip 260 has an excellent level and precisely controlled height after chip attaching on the chip cavity so as to enhance the quality of image sensor package.

The above description of embodiments of this invention is intended to be illustrative and not limiting. Other embodiments of this invention will be obvious to those skilled in the art in view of the above disclosure.

What is claimed is:

1. A method for manufacturing a semiconductor package comprising the steps of:
   providing a board having at least a region for forming a chip cavity inwall being defined;
   providing a metal foil with a layer of adhesive resin formed over one surface thereof, the adhesive resin having a first adhesive surface attached to the metal foil and a second adhesive surface exposed;
   attaching the second adhesive surface of the adhesive resin to the board by lamination of the board with the metal foil;
   forming a through opening corresponding to the region, the through opening passing through the board, the adhesive resin and the metal foil in a manner that the board has the chip cavity inwall in the through opening;
   removing the metal foil to expose the first adhesive surface of the adhesive resin;
   attaching the first adhesive surface of the adhesive resin to a carrier plate to connect with the board via lamination; and
   disposing a chip on the carrier plate within the chip cavity inwall of the board.

2. The method of claim 1, further comprising: forming a metal layer on the chip cavity inwall of the board prior to removing of the metal foil.

3. The method of claim 1, wherein the adhesive resin has multi-stage curing characteristics.

4. The method of claim 3, wherein the adhesive resin is cured between about 5-50% after attaching of the carrier plate.

5. The method of claim 1, wherein the adhesive resin is selected from one of the group consisting of epoxy resin, BT resin and PI resin.

6. The method of claim 1, wherein the adhesive resin contains Ag particles.

7. The method of claim 1, wherein the metal foil is removed by etching.

8. The method of claim 1, wherein the metal foil is removed by peeling.

9. The method of claim 1, wherein the through opening is formed by punching.

10. The method of claim 1, wherein the through opening is formed by routing.

11. The method of claim 1, wherein the board is a substrate having circuit patterns.

12. The method of claim 11, wherein the carrier plate is a heat spreader.

13. The method of claim 11, further comprising: wire-bonding the chip to the board.

14. The method of claim 11, further comprising: forming an encapsulant in the chip cavity inwall of the board.

15. The method of claim 11, further comprising: placing a plurality of solder balls on the board.

16. The method of claim 1, wherein the carrier plate is a substrate having circuit patterns.

17. The method of claim 16, wherein the board is a substrate core layer.

18. The method of claim 16, further comprising: wire-bonding the chip to the carrier plate.

19. The method of claim 16, further comprising: forming an encapsulant in the chip cavity inwall of the board.

20. The method of claim 16, further comprising: disposing a transparent cover on the board to hermetically seal the chip.

21. The method of claim 16, further comprising: placing a plurality of solder balls on the carrier plate.

22. The method of claim 1, wherein the metal foil is Resin Coated Copper foil (RCC).

* * * * *